United States Patent
Reddy et al.

(10) Patent No.: US 10,977,404 B1
(45) Date of Patent: Apr. 13, 2021

(54) DYNAMIC SCAN CHAIN AND METHOD

(71) Applicant: Xilinx, Inc., San Jose, CA (US)

(72) Inventors: Srinivas T. Reddy, Fremont, CA (US);
Dinesh Gaitonde, Fremont, CA (US);
Ritesh Mani, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/775,016

(22) Filed: Jan. 28, 2020

(51) Int. Cl.
*G06F 30/347* (2020.01)
*G01R 31/3177* (2006.01)

(52) U.S. Cl.
CPC ....... *G06F 30/347* (2020.01); *G01R 31/3177* (2013.01)

(58) Field of Classification Search
CPC .......................... G06F 30/347; G01R 31/3177
USPC .................................................. 716/110, 116
See application file for complete search history.

(56) References Cited

U.S. PATENT DOCUMENTS

| | | | |
|---|---|---|---|
| 5,592,493 A * | 1/1997 | Crouch et al. | G01R 31/318536 324/73.1 |
| 5,619,511 A * | 4/1997 | Sugisawa et al. | G01R 31/318541 714/30 |
| 6,615,380 B1 * | 9/2003 | Kapur | G01R 31/318544 714/728 |
| 7,557,741 B2 * | 7/2009 | Van Veldhoven et al. | H03M 3/362 341/139 |
| 7,937,634 B2 * | 5/2011 | Almukhaizim et al. | G06F 11/267 714/726 |
| 8,301,947 B1 * | 10/2012 | Makar et al. | G01R 31/318558 714/729 |
| 9,588,176 B1 * | 3/2017 | Hutton et al. | G01R 31/3177 |
| 10,216,254 B1 * | 2/2019 | Rao et al. | G06F 9/3012 |
| 10,234,505 B1 * | 3/2019 | Shivaray et al. | G01R 31/3177 |
| 10,317,464 B2 * | 6/2019 | Chaudhuri | G01R 31/31724 |

OTHER PUBLICATIONS

Virtex FPGA Series Configuration and Readback; XAPP138 (v2.8) Mar. 11, 2005.
Tapp; Configuration Readback Capture in UltraScale FPGAs; XAPP1230 (v1.1) Nov. 20, 2015.

* cited by examiner

*Primary Examiner* — Sun J Lin
(74) *Attorney, Agent, or Firm* — Crawford Maunu PLLC

(57) ABSTRACT

Disclosed approaches for dynamically creating one or more scan chains in a programmable integrated circuit (IC) include placing elements of a circuit design on first registers of the programmable IC. A processor can determine second registers of the programmable IC that are unused by the circuit design after placing the elements of the circuit design. Data-out pins of the first registers are coupled to data-in pins of the second registers, respectively, and the second registers are coupled into a scan chain.

20 Claims, 7 Drawing Sheets

the following description, numerous specific details are

DYNAMIC SCAN CHAIN AND METHOD

TECHNICAL FIELD

The disclosure generally relates to reading back user state information using scan chains for programmable integrated circuits (ICs).

BACKGROUND

Programmable logic devices (PLDs) are a well-known type of programmable integrated circuit (IC) that can be programmed to perform specified logic functions. One type of PLD, the field programmable gate array (FPGA), typically includes an array of programmable tiles. These programmable tiles comprise various types of logic blocks, which can include, for example, input/output blocks (IOBs), configurable logic blocks (CLBs), dedicated random access memory blocks (BRAM), multipliers, digital signal processing blocks (DSPs), processors, clock managers, delay lock loops (DLLs), bus or network interfaces such as Peripheral Component interconnect Express (PCIe) and Ethernet and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

SUMMARY

A disclosed method includes placing elements of a circuit design on first registers of a programmable integrated circuit (IC) by a computer processor. In performing the method, the computer processor determines second registers of the programmable IC that are unused by the circuit design after placing the elements of the circuit design. The method includes coupling data-out pins of the first registers to data-in pins of the second registers, respectively, and coupling the second registers into a scan chain.

A disclosed system includes a processor and a memory arrangement coupled to the processor. The memory arrangement is configured with instructions that when executed by the processor cause the processor to place elements of a circuit design on first registers of a programmable integrated circuit (IC). The instruction cause the processor to determine second registers of the programmable IC that are unused by the circuit design after placing the elements of the circuit design. The instructions cause the computer processor to couple data-out pins of the first registers to data-in pins of the second registers, respectively, and couple the second registers into a scan chain.

A disclosed circuit arrangement includes programmable logic circuitry having a plurality of registers available for implementation of an application circuit. The circuit arrangement includes a configuration memory coupled to the programmable logic circuitry and configured with configuration data. The application circuit is implemented by the programmable logic circuitry in response to the configuration data in the configuration memory. First registers of the plurality of registers are used in implementing the application circuit, and second registers of the plurality of registers are unused in implementing the application circuit. A scan chain includes ones of the second registers that are coupled to the first registers.

Other features will be recognized from consideration of the Detailed Description and Claims, which follow.

BRIEF DESCRIPTION OF THE DRAWINGS

Various aspects and features of the method and system will become apparent upon review of the following detailed description and upon reference to the drawings in which.

DETAILED DESCRIPTION

Figure 1:
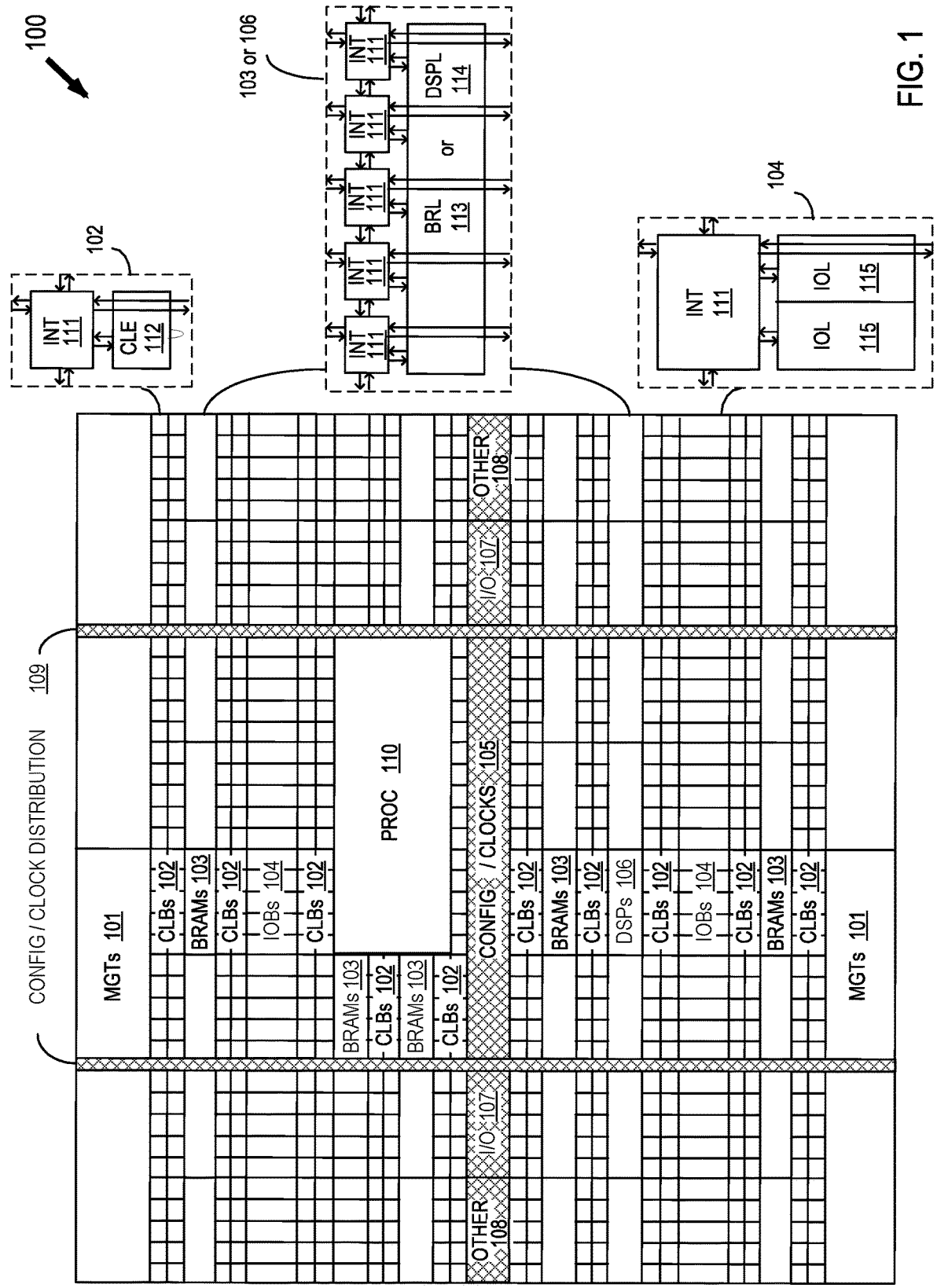
FIG. 1 shows a programmable integrated circuit (IC) on which on which dynamic scan chains can be constructed according to the disclosed approaches.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

In debugging and analyzing behavior of a circuit implemented on a programmable IC, a developer will often verify that the state of the configuration memory is correct and obtain the states of registers used by the application circuit. For ease of reference, the registers of the programmable IC that are available for use to implement a circuit design will be referred to herein as "available registers." "Registers" as used herein include flip-flops and latches. Those of the available registers that are used to implement a circuit design will be referred to herein as "design registers."

The states of the design registers can be obtained through scan registers. In prior programmable ICs, every available register has an associated scan register that is coupled to and dedicated to capturing the state of the available register. The scan registers are permanently coupled to the available registers and also coupled to a configuration bus, through which the register states can be read from the device.

Extracting the states of the design registers through the scan registers can be time consuming. The speed at which the states of the design registers can be read is limited by the bandwidth of the configuration bus and the number of scan registers. Circuit designs can employ millions of registers of the programmable IC, and having a configuration bus that operates in the kilohertz range makes extracting the states of design registers a lengthy process.

The disclosed approaches significantly reduce the time required to obtain the states of programmable IC registers used by an implemented circuit through the repurposing of available registers of the programmable IC that are unused by the implemented circuit. Selected ones of the unused registers are repurposed as shadow registers for the design registers. The disclosed approaches determine those of the available registers are used by the implemented circuit and those of the available registers that are not used by the implemented circuit after placing the circuit design. For each of the design registers, the disclosed approaches couple one of the unused registers as a shadow register to receive the data-out signal from the design register. The shadow registers are coupled into a scan chain, which can be coupled to a dynamic scan interface circuit. The unused registers selected for use as shadow registers and the dynamic scan interface circuit can be clocked at a much greater frequency than can the configuration bus and dedicated scan registers, thereby significantly reducing the time to read out state data from the programmable IC.

FIG. 1 shows a programmable integrated circuit (IC) 100 on which dynamic scan chains can be constructed according to the disclosed approaches. The programmable IC may also be referred to as a System On Chip (SOC) that includes field programmable gate array logic (FPGA) along with other programmable resources. FPGA logic may include several different types of programmable logic blocks in the array. For example, FIG. 1 illustrates programmable IC 100 that includes a large number of different programmable tiles including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing blocks (DSPs) 106, specialized input/output blocks (I/O) 107, for example, clock ports, and other programmable logic 108 such as digital clock managers, analog-to-digital converters, system monitoring logic, and so forth. Some programmable IC having FPGA logic also include dedicated processor blocks (PROC) 110 and internal and external reconfiguration ports (not shown). The disclosed methods and circuits can also be implemented on an adaptive compute acceleration platform (ACAP). An ACAP has FPGA fabric with distributed memory and hardware-programmable DSP blocks, a multicore SoC, and one or more software programmable, yet hardware adaptable, compute engines, all connected through a network on chip (NoC).

In some FPGA logic, each programmable tile includes a programmable interconnect element (INT) 111 having standardized connections to and from a corresponding interconnect element in each adjacent tile. Therefore, the programmable interconnect elements taken together implement the programmable interconnect structure for the illustrated FPGA logic. The programmable interconnect element INT 111 also includes the connections to and from the programmable logic element within the same tile, as shown by the examples included at the top of FIG. 1.

For example, a CLB 102 can include a configurable logic element (CLE) 112 that can be programmed to implement user logic, plus a single programmable interconnect element INT 111. A BRAM 103 can include a BRAM logic element (BRL) 113 in addition to one or more programmable interconnect elements. Typically, the number of interconnect elements included in a tile depends on the height of the tile. The illustrated BRAM tile has the same height as five CLBs, but other numbers (e.g., four) can also be used. A DSP tile 106 can include a DSP logic element (DSPL) 114 in addition to an appropriate number of programmable interconnect elements. An 10B 104 can include, for example, two instances of an input/output logic element (IOL) 115 in addition to one instance of the programmable interconnect element INT 111. As will be clear to those of skill in the art, the actual I/O bond pads connected, for example, to the I/O logic element 115, are manufactured using metal layered above the various illustrated logic blocks, and typically are not confined to the area of the input/output logic element 115.

A columnar area near the center of the die (shown shaded in FIG. 1) is used for configuration, clock, and other control logic. Horizontal areas 109 extending from this column are used to distribute the clocks and configuration signals across the breadth of the programmable IC. Note that the references to "columnar" and "horizontal" areas are relative to viewing the drawing in a portrait orientation.

Some programmable ICs utilizing the architecture illustrated in FIG. 1 include additional logic blocks that disrupt the regular columnar structure making up a large part of the programmable IC. The additional logic blocks can be programmable blocks and/or dedicated logic. For example, the processor block PROC 110 shown in FIG. 1 spans several columns of CLBs and BRAMs.

The CLBs have registers (not shown) that can be used to store states of signals generated by circuit design logic implemented in the CLBs. In implementing a circuit design on the programmable IC, a design tool will place some elements of the circuit design on some of the CLB registers, leaving other CLB registers unused. In accordance with the disclosed approaches, after placing the circuit design the design tool can determine which of the CLB registers are unused by the circuit design. The design tool can then pair the design registers with the unused registers. The registers can be paired, for example, by selecting for each of the design registers, one of the unused registers that is nearest the design register on the programmable IC. The design tool can then modify the circuit design to specify coupling of the data-out pins of the design registers to the data-in pins of the paired unused registers. The design tool can further modify the circuit design to specify connecting the paired unused registers into a scan chain. Continuing with the design implementation flow, the design tool can route the circuit design and generate configuration data for configuring the programmable IC to implement the circuit design and generated scan chain.

Note that FIG. 1 is intended to illustrate only an exemplary programmable IC architecture. The numbers of logic blocks in a column, the relative widths of the columns, the number and order of columns, the types of logic blocks included in the columns, the relative sizes of the logic blocks, and the interconnect/logic implementations included at the top of FIG. 1 are purely exemplary. For example, in an actual programmable IC, more than one adjacent column of CLBs is typically included wherever the CLBs appear, to facilitate the efficient implementation of user logic.

Figure 2:
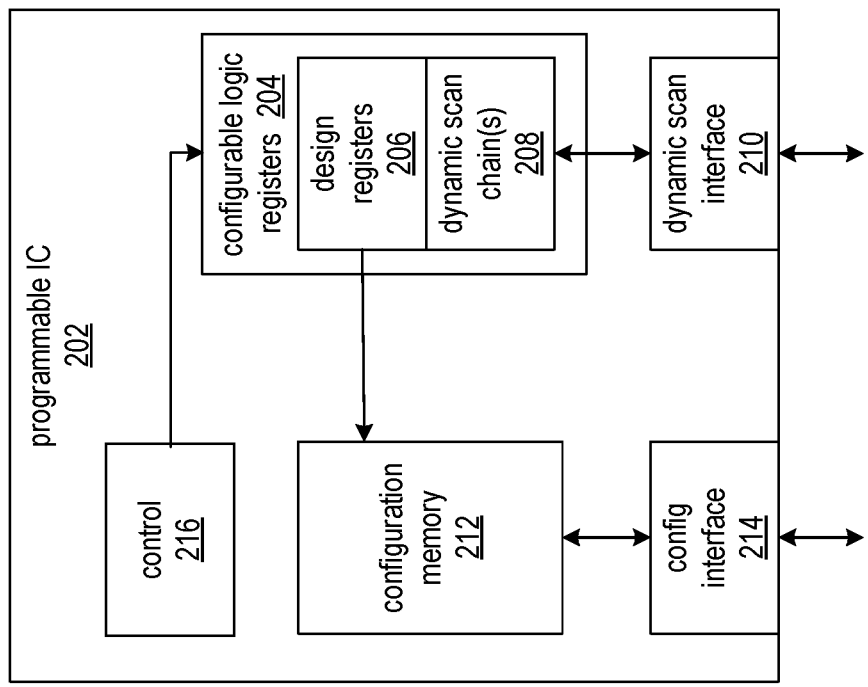
FIG. 2 shows an exemplary programmable IC having a dynamic scan chain.

FIG. 2 shows an exemplary programmable IC 202 having a dynamic scan chain. The exemplary programmable IC 202 supports both an existing approach and a dynamic scan chain for readback of state data. It will be recognized, however, that a programmable IC need not implement both approaches for readback, and use of the dynamic scan chain alone can be sufficient.

The programmable IC has configurable logic (not shown), which can implement logic circuits according to the data stored in the configuration memory 212. A circuit design can be implemented by loading configuration data into the configuration memory through the configuration interface 214. In some programmable ICs, the configuration interface provides boundary scan and SelectMAP interfaces.

The configurable logic registers 204 are the available registers for use in implementing a circuit design in the configurable logic. Of the available registers, the design registers 206 are those used by the configurable logic in implementing a circuit design.

According to the disclosed approaches, configurable logic registers that are not used in the implemented circuit design, can be used to make one or more dynamic scan chains 208. Access to the dynamic scan chain(s) can be provided by the dynamic scan interface circuit 210. The dynamic scan interface circuit provides an interface to store the scanned data to external memory or output to another peripheral circuit or device. In exemplary implementations, the dynamic scan interface can implement a bus interface such as the Advanced eXtensible Interface (AXI) or Advanced High-performance Bus (AHB) Shared Bus and AMBA. For increased bandwidth and reduced readback time, the dynamic scan interface can access multiple input/output channels of the programmable IC. The dynamic scan chains can be controlled by a control circuit 216 that could be implemented either as a dedicated logic circuit within the programmable IC or as a logic implemented using programmable logic circuitry of the programmable IC.

The dynamic scan interface circuit 210 reduces readback time by operating at a greater clock frequency than the configuration interface 214 and by avoiding readback through the configuration memory 212. According to prior approaches, "readback verification" is used to verify the validity of the configuration data in the configuration memory 212, and "readback capture" is used to obtain the states of the design registers. Readback capture can be used for hardware debugging and functional verification. In prior readback capture approaches, the internal register states are loaded into unused spaces in the configuration memory 212 which may be extracted by a readback of the configuration memory.

Figure 3:
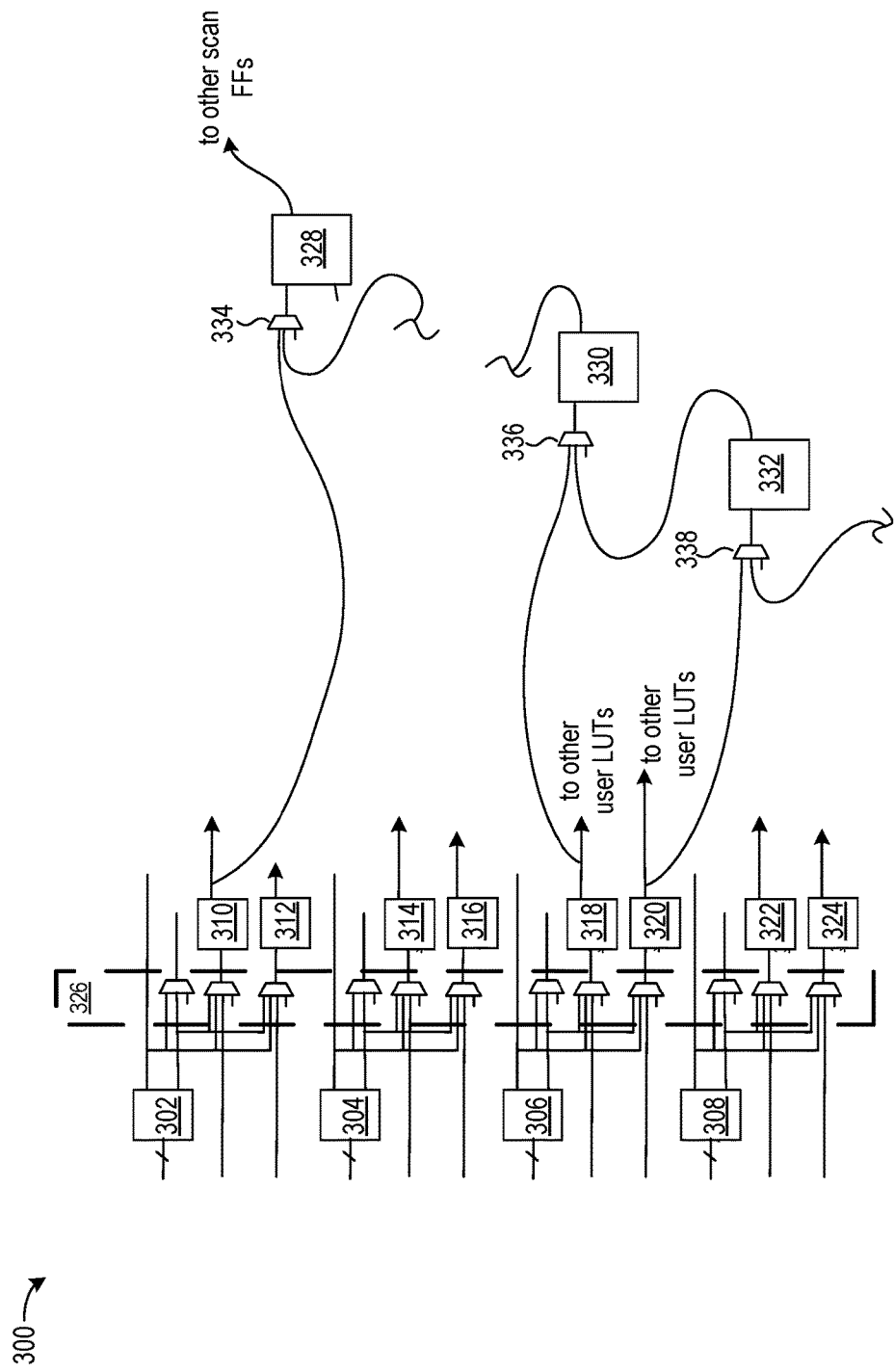
FIG. 3 shows circuitry of a programmable IC in which unused ones of the available registers are coupled to be used as shadow registers to the design registers.

FIG. 3 shows circuitry 300 of a programmable IC in which unused ones of the available registers are coupled to be used as shadow registers to the design registers. The exemplary circuitry includes programmable logic look-up table (LUTs) 302, 304, 306, and 308. Flip-flops 310, 318, and 320 are used by the design, and flip-flops 312, 314, 316, 322, 324, 328, 330, and 332 are not used. The LUTs implement functions as defined by the state of the configuration memory 212 (FIG. 2). In the exemplary circuitry, flip-flops 310, 318, and 320 are design registers and can be coupled to the LUTs through multiplexers 326, and flip-flops 312, 314, 316, 322, 324, 328, 330, and 332 are examples of unused registers. As flip-flops 328, 330, and 332 are available but unused, it will be recognized that the alternative inputs to the multiplexers 334, 336, and 338 would be from sources similar to the sources of inputs to the multiplexers 326. After placing the circuit design, the circuit design tool determines which of the available registers are unused.

Once the unused registers have been identified, the design tool selects for each of the design registers one of the unused registers to serve as a shadow register. In one approach, the shadow register selected for a design register is the nearest unused register based on layout information that describes the programmable IC. The design tool can then modify the specification of the circuit design to specify coupling of the data-out pins of the design registers to the data-in pins of the selected ones of the registers, respectively. The circuit design specification is further modified to couple the shadow registers into one or more scan chains.

The flip-flops 328, 330, and 332 show a portion of a scan chain for the design flip-flops 310, 318, and 320. The data-out pin of user flip-flop 310 is coupled to the data-in pin of shadow flip-flop 328, the data-out pin of user flip-flop 318 is coupled to the data-in pin of shadow flip-flop 330, and the data-out pin of user flip-flop 320 is coupled to the data-in pin of shadow flip-flop 332. User flip-flops 312, 314, 316, 322, and 324 need not be coupled to shadow flip-flops as flip-flops 312, 314, 316, 322, and 324 are unused.

Figure 4:
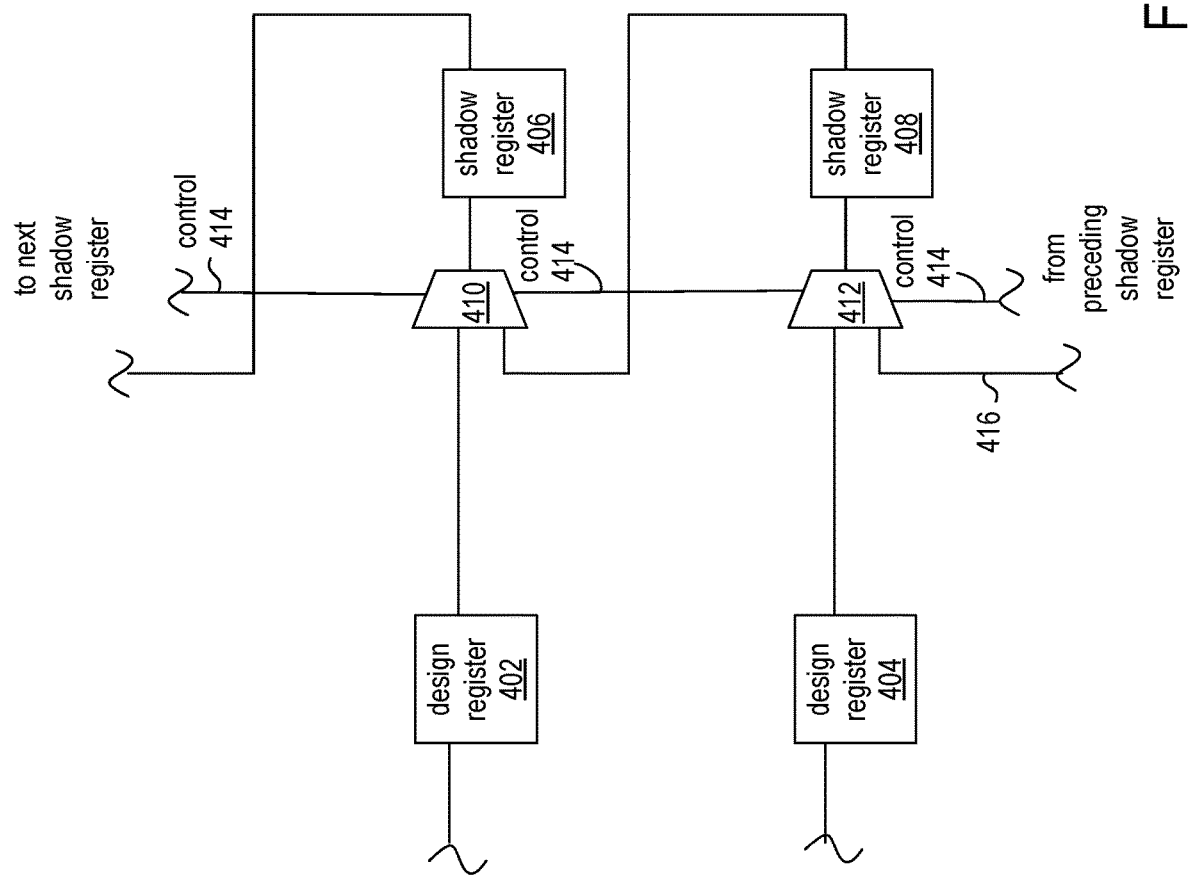
FIG. 4 shows an exemplary circuit having design registers and shadow registers coupled as a portion of a scan chain.

The dynamic scan interface circuit 210 (FIG. 2) can be coupled to the enable inputs of the shadow flip-flops and to the control inputs of the multiplexers (e.g., 334, 336, 338) that select which signal to provide as input to the shadow flip-flops. In response to receiving a readback command, the dynamic scan interface circuit can enable the shadow flip-flops and control the multiplexers to select the signals from the user flip-flops. After the data from the user flip-flops has been captured, the dynamic scan interface circuit can continue to enable the flip-flops and control the multiplexers to select the signal from the preceding flip-flop in the scan chain while enabling the shadow flip-flops FIG. 4 shows an exemplary circuit having design registers and shadow registers coupled as a portion of a scan chain. The circuit includes design registers 402 and 404 and shadow registers 406 and 408. Inputs to the shadow register are controlled by multiplexers 410 and 412, and the control signal 414 is provided to the multiplexers 410 and 412 by the dynamic scan interface circuit 210 (FIG. 2).

Data-out pins of the design registers 402 and 404 are coupled to the data-in pins of the shadow registers 406 and 408 through multiplexers 410 and 412, respectively. In capture mode, the control signal 414 controls the multiplexers 410 and 412 to select the signals from the design registers 402 and 404 for input to the shadow registers 406 and 408, respectively. In scan-out mode, the control signal 414 controls multiplexer 410 to select the signal from shadow register 408 and controls multiplexer 412 to select the signal 416 from the preceding shadow register (not shown) in the scan chain.

Figure 5:
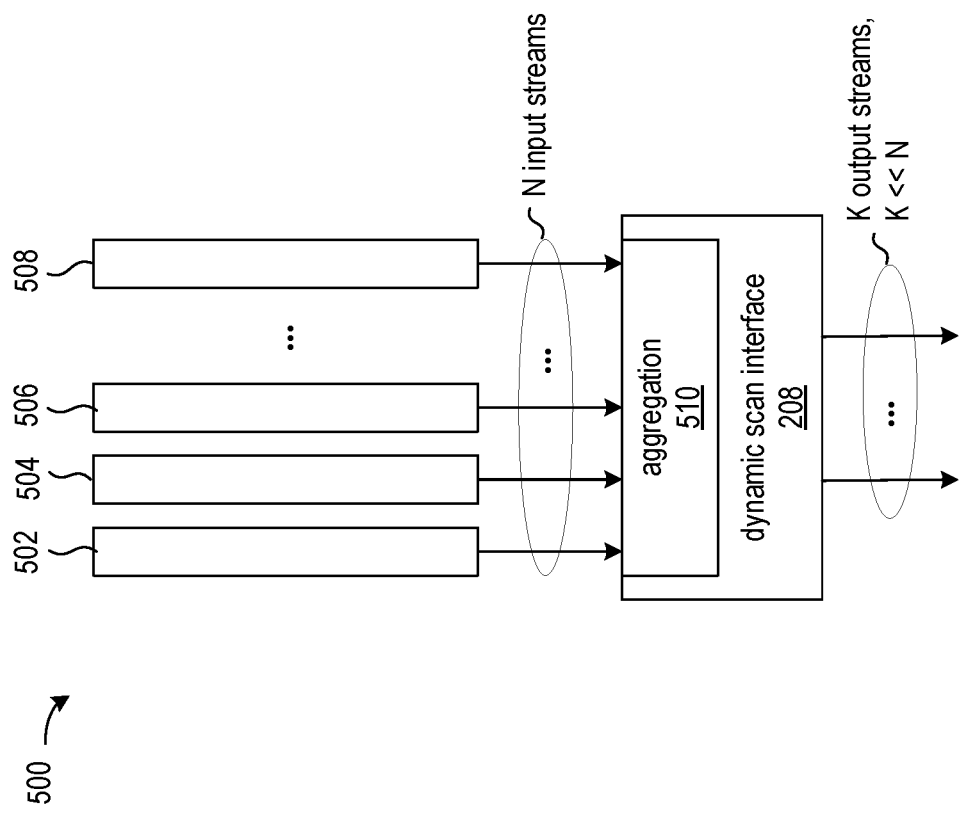
FIG. 5 shows a circuit arrangement having multiple scan chains.

FIG. 5 shows a circuit arrangement 500 having multiple scan chains 502, 504, 506, . . . , 508. Each scan chain can be formed from the available unused registers of a programmable IC as described above.

The outputs of the scan chains are coupled to an aggregation circuit 510, which is part of the dynamic scan interface 208. The aggregation circuit can combine the outputs from multiple ones of the scan chains into a single stream of data for output via the dynamic scan interface. For example, the aggregation circuit can frame portions of the data output from each scan chain and time-multiplex the frames from the multiple scan chains for output by the dynamic scan interface over a shared output channel. The dynamic scan interface can output scan data over a single or over multiple channels for increased bandwidth. For example, in a circuit having N scan chains producing N input streams, the aggregation circuit can combine the N input streams to K output streams, where K is much less than N.

Figure 6:
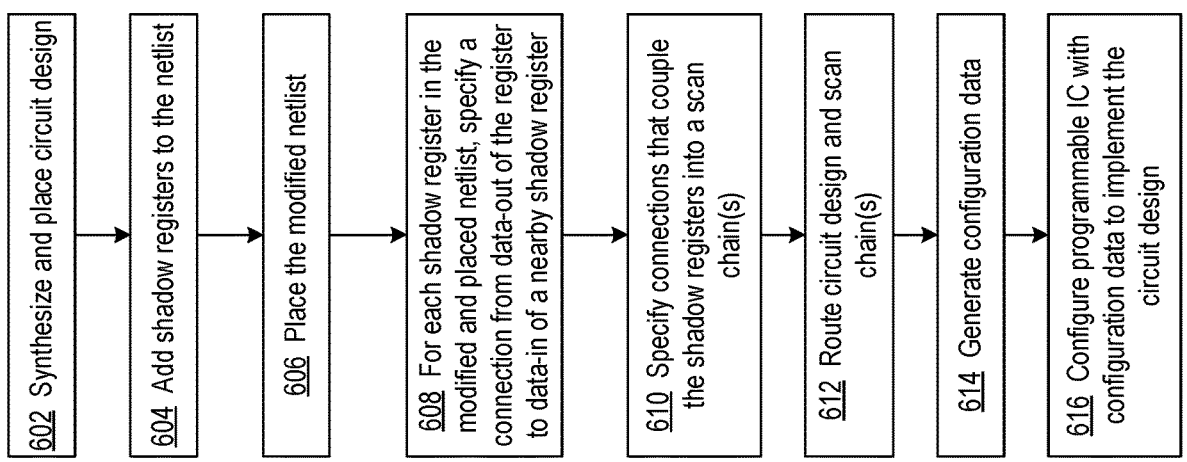
FIG. 6 is a flowchart of an exemplary process of dynamically creating a scan chain in a programmable IC.

FIG. 6 is a flowchart of an exemplary process of dynamically creating a scan chain in a programmable IC. At block 602, a circuit design tool synthesizes a circuit design and places circuit elements in components of a target programmable IC, such as an FPGA. After placing the circuit design, at block 604 the design tool adds shadow registers to the netlist of the circuit design. In one approach, the design tool adds a shadow register for each design register. In another approach, the design tool can add shadow registers for only those registers of the circuit design that have been annotated to be shadowed.

At block 606, the design tool places the modified netlist, which specifies the added shadow registers. The design tool can determine those registers of the programmable IC that are unused. The unused registers can be determined by comparing a database that identifies the available registers of the IC to placement data generated by the initial placement (602), identifying assignments of circuit elements to specific ones of the registers of the programmable IC.

Once the added shadow registers have been placed, at block 608 the design tool modifies the netlisted circuit design to specify connections from the data-out pins of the design registers to the data-in pins of the shadow registers based on the placed locations of the design registers and shadow registers. In one approach, the design tool determines for each design register, one of the shadow registers that is nearest and not paired with another design register. The design tool then specifies a connection from the design register to the selected shadow register.

At block 610, the design tool specifies connections between the shadow registers to form one or more scan chains, and specifies connections of the scan chain(s) to output circuitry of the programmable IC, which can include an aggregation circuit. Multiple scan chains may be suitable in scenarios in which constraining the overall length of the scan chain is desirable or separate scan chains are needed in different areas of the programmable IC. A user can specify a maximum length to the design tool, or the design tool can automatically determine that separate scan chains are needed to cover different areas of the programmable IC. In forming the scan chain(s), the design tool can modify the circuit design to specify connections from the data-out pin of a shadow register to the data-in pin of another shadow register. The design tool can further specify data and control connections between the scan chain(s) and the specification of the dynamic scan interface circuit 210 (FIG. 2).

At block 612, the design tool routes the circuit design after specifying the connections from the design registers to the shadow registers and specifying the connections to form a scan chain(s). At block 614, the design tool generates configuration data from which the circuit design can be implemented as a circuit on the target programmable IC. A circuit can be implemented at block 616 by configuring a programmable IC with the configuration data.

Figure 7:
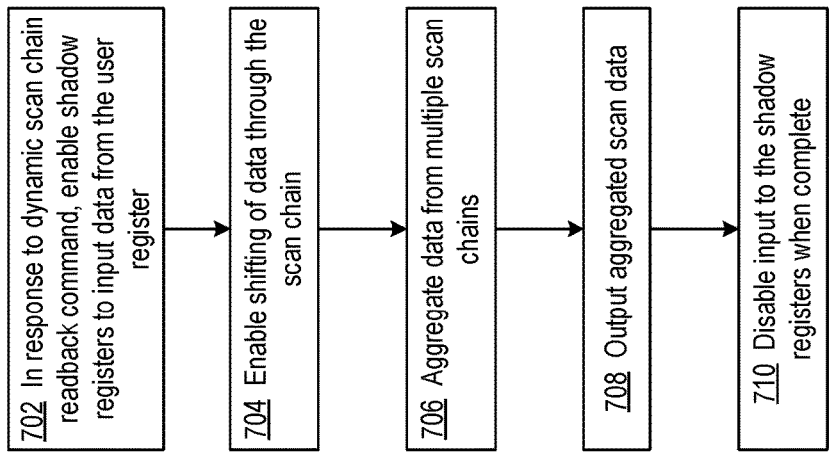
FIG. 7 is a flowchart that shows an exemplary process for obtaining scan data from a dynamic scan chain configured in a programmable IC.

FIG. 7 is a flowchart that shows an exemplary process for obtaining scan data from a dynamic scan chain configured in a programmable IC. At block 702, in response to input of a readback command, a dynamic scan interface circuit on the programmable IC enables the shadow registers and controls the multiplexers (e.g., 334, 336, and 338) to input signals from the design registers. At block 704, the dynamic scan interface circuit continues to enable the shadow registers and adjusts control of the multiplexers (e.g., 334, 336, and 338) to shift data through the scan chain. In an application having multiple scan chains, an aggregation circuit at block 706 aggregates the data from the multiple scan chains. Aggregating the data can entail framing portions of the data from the multiple scan chains and time-multiplexing the portions over one or more output channels. The framed portions can include additional header data for identification of the scan chains.

At block 708, the dynamic scan interface circuit outputs the aggregated scan data. The output channel can be a memory bus, a high-speed serial channel, an internetwork, etc. When collection of the scan data is complete, at block 710 the dynamic scan interface circuit disables input to the shadow registers.

Figure 8:
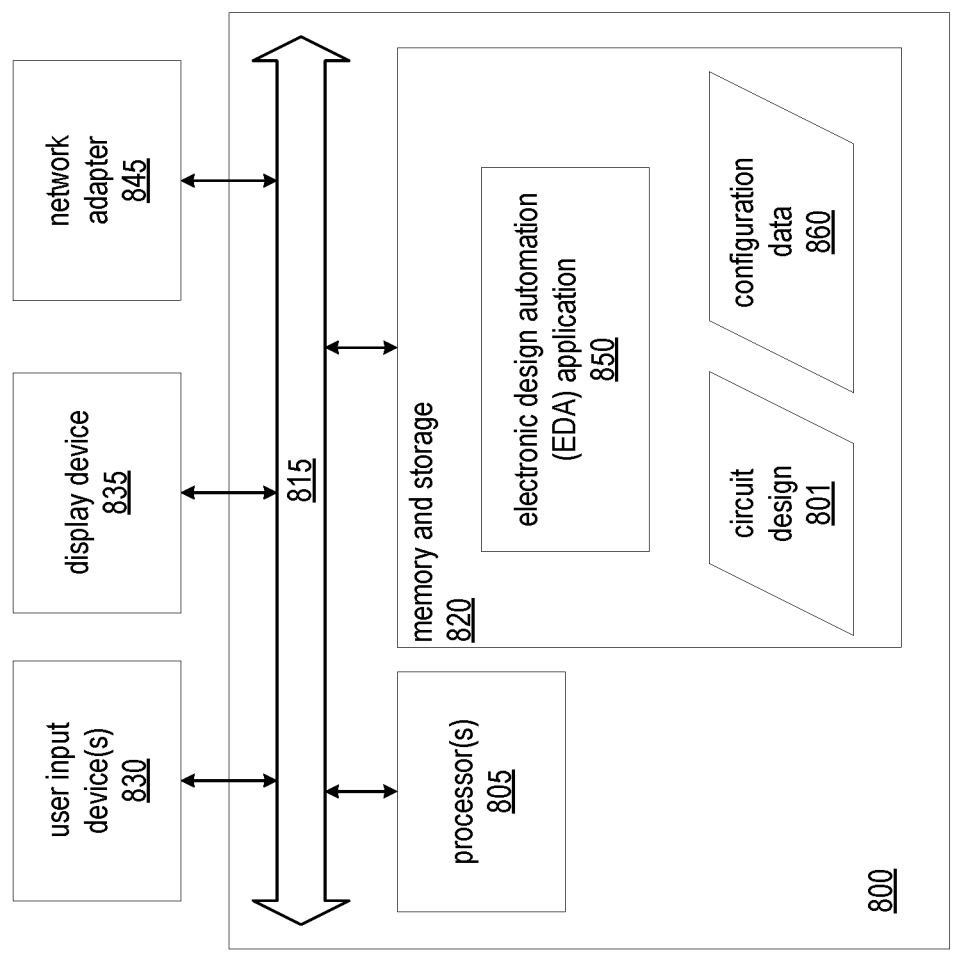
FIG. 8 is a block diagram illustrating an exemplary data processing system.

FIG. 8 is a block diagram illustrating an exemplary data processing system (system) 800. System 800 is an example of an electronic design automation (EDA) system. As pictured, system 800 includes at least one processor circuit (or "processor"), e.g., a central processing unit (CPU) 805 coupled to memory and storage arrangement 820 through a system bus 815 or other suitable circuitry. System 800 stores program code and circuit design 801 within memory and storage arrangement 820. Processor 805 executes the program code accessed from the memory and storage arrangement 820 via system bus 815. In one aspect, system 800 is implemented as a computer or other data processing system that is suitable for storing and/or executing program code. It should be appreciated, however, that system 800 can be implemented in the form of any system including a processor and memory that is capable of performing the functions described within this disclosure.

Memory and storage arrangement 820 includes one or more physical memory devices such as, for example, a local memory (not shown) and a persistent storage device (not shown). Local memory refers to random access memory or other non-persistent memory device(s) generally used during actual execution of the program code. Persistent storage can be implemented as a hard disk drive (HDD), a solid state drive (SSD), or other persistent data storage device. System 800 may also include one or more cache memories (not shown) that provide temporary storage of at least some program code and data in order to reduce the number of times program code and data must be retrieved from local memory and persistent storage during execution.

Input/output (I/O) devices such as user input device(s) 830 and a display device 835 may be optionally coupled to system 800. The I/O devices may be coupled to system 800 either directly or through intervening I/O controllers. A network adapter 845 also can be coupled to system 800 in order to couple system 800 to other systems, computer systems, remote printers, and/or remote storage devices through intervening private or public networks. Modems, cable modems, Ethernet cards, and wireless transceivers are examples of different types of network adapter 845 that can be used with system 800.

Memory and storage arrangement 820 may store an EDA application 850. EDA application 850, being implemented in the form of executable program code, is executed by processor(s) 805. As such, EDA application 850 is considered part of system 800. System 800, while executing EDA application 850, receives and operates on circuit design 801. In one aspect, system 800 performs a design flow on circuit design 801, and the design flow can include synthesis, mapping, placement, routing, and the automatic generation of a scan chain from unused ones of the available registers of the programmable IC as described herein. System 800 modifies circuit design 801 to include a scan chain having shadow registers for the design registers, and generates configuration data 860, from which a circuit and dynamic scan chain can be implemented on a programmable IC.

EDA application 850, circuit design 801, configuration data 860, and any data items used, generated, and/or operated upon by EDA application 850 are functional data structures that impart functionality when employed as part of system 800 or when such elements, including derivations and/or modifications thereof, are loaded into an IC such as a programmable IC causing implementation and/or configuration of a circuit design within the programmable IC.

Though aspects and features may in some cases be described in individual figures, it will be appreciated that features from one figure can be combined with features of another figure even though the combination is not explicitly shown or explicitly described as a combination.

The methods and system are thought to be applicable to a variety of systems for obtaining state information of a circuit implemented on a programmable IC. Other aspects and features will be apparent to those skilled in the art from consideration of the specification. It is intended that the specification and drawings be considered as examples only, with a true scope of the invention being indicated by the following claims.

What is claimed is:

1. A method comprising:
   placing elements of a circuit design on first registers of a programmable integrated circuit (IC) by a computer processor;
   determining, by the computer processor, second registers of the programmable IC that are unused by the circuit design after placing the elements of the circuit design;
   coupling data-out pins of the first registers to data-in pins of the second registers, respectively; and
   coupling the second registers into a scan chain.

2. The method of claim 1, further comprising selecting a nearest one register of the second registers to each register of the first registers for coupling the data-out pin of the first registers to the data-in pins of the second register.

3. The method of claim 1, further comprising coupling the second registers into a plurality of scan chains.

4. The method of claim 3, further comprising:
   determining a maximum length; and
   limiting a number of registers in each scan chain of the plurality of scan chains to the maximum length.

5. The method of claim 3, further comprising coupling the plurality of scan chains to a plurality of output circuits of the programmable IC.

6. The method of claim 3, further comprising coupling the plurality of scan chains to an aggregation circuit, wherein the aggregation circuit is configured to combine two or more scan chains of the plurality of scan chains for output from the programmable IC over a same output channel.

7. The method of claim 1, further comprising determining the first registers in response to designations that the first registers are to be scannable in a specification of the circuit design.

8. The method of claim 1, wherein the first registers include all registers of the circuit design.

9. The method of claim 1, further comprising enabling input of data from the first registers to the second registers in response to a readback command input to the programmable IC.

10. The method of claim 1, further comprising:
    specifying connections between the data-out pins of the first registers and the data-in pins of the second registers in the circuit design;
    specifying the scan chain in the circuit design after specifying the connections;
    routing the circuit design after specifying the connections and specifying the scan chain; and
    generating configuration data that implements the circuit design on the programmable IC.

11. A system comprising:
    a processor;
    a memory arrangement coupled to the processor and configured with instructions that, when executed by the processor, cause the processor to perform operations including:
       placing elements of a circuit design on first registers of a programmable integrated circuit (IC);
       determining second registers of the programmable IC that are unused by the circuit design after placing the elements of the circuit design;
       coupling data-out pins of the first registers to data-in pins of the second registers, respectively; and
       coupling the second registers into a scan chain.

12. The system of claim 11, wherein the memory arrangement is further configured with instructions that, when executed by the processor, cause the processor to select a nearest one register of the second registers to each register of the first registers for coupling the data-out pin of the first registers to the data-in pins of the second register.

13. The system of claim 11, wherein the memory arrangement is further configured with instructions that, when executed by the processor, cause the processor to couple the second registers into a plurality of scan chains.

14. The system of claim 13, wherein the memory arrangement is further configured with instructions that, when executed by the processor, cause the processor to:
    determine a maximum length; and
    limit a number of registers in each scan chain of the plurality of scan chains to the maximum length.

15. The system of claim 13, wherein the memory arrangement is further configured with instructions that, when executed by the processor, cause the processor to couple the plurality of scan chains to a plurality of output circuits of the programmable IC.

16. The system of claim 13, wherein the memory arrangement is further configured with instructions that, when executed by the processor, cause the processor to couple the plurality of scan chains to an aggregation circuit, wherein the aggregation circuit is configured to combine two or more scan chains of the plurality of scan chains for output from the programmable IC over a same output channel.

17. The system of claim 11, wherein the memory arrangement is further configured with instructions that, when executed by the processor, cause the processor to determine the first registers in response to designations that the first registers are to be scannable in a specification of the circuit design.

18. The system of claim 11, wherein the memory arrangement is further configured with instructions that, when executed by the processor, cause the processor to enable input of data from the first registers to the second registers in response to a readback command input to the programmable IC.

19. The system of claim 11, wherein the memory arrangement is further configured with instructions that, when executed by the processor, cause the processor to:
    specify connections between the data-out pins of the first registers and the data-in pins of the second registers in the circuit design;
    specify the scan chain in the circuit design after specifying the connections;

route the circuit design after specifying the connections and specifying the scan chain; and generate configuration data that implements the circuit design on the programmable IC.

20. A circuit arrangement comprising:

programmable logic circuitry having a plurality of registers available for implementation of an application circuit;

a configuration memory coupled to the programmable logic circuitry and configured with configuration data, wherein the application circuit is implemented by the programmable logic circuitry in response to the configuration data in the configuration memory, first registers of the plurality of registers are used in implementing the application circuit, and second registers of the plurality of registers are unused in implementing the application circuit; and a scan chain that includes ones of the second registers that are coupled to the first registers.

* * * * *